United States Patent
Chen et al.

(10) Patent No.: US 9,905,509 B2
(45) Date of Patent: Feb. 27, 2018

(54) INVERTED-T SHAPED VIA FOR REDUCING ADVERSE STRESS-MIGRATION EFFECTS

(71) Applicant: Macronix International Co., Ltd., Hsinchu (TW)

(72) Inventors: Yen-Lu Chen, Hsinchu (TW); Shih-Ping Hong, Hsinchu (TW); Ta Hung Yang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 37 days.

(21) Appl. No.: 14/341,351

(22) Filed: Jul. 25, 2014

(65) Prior Publication Data

US 2016/0027729 A1    Jan. 28, 2016

(51) Int. Cl.
*H01L 23/522* (2006.01)
*H01L 21/768* (2006.01)
*H01L 21/311* (2006.01)

(52) U.S. Cl.
CPC .... *H01L 23/5226* (2013.01); *H01L 21/31116* (2013.01); *H01L 21/76804* (2013.01); *H01L 21/76816* (2013.01); *H01L 2924/0002* (2013.01)

(58) Field of Classification Search
CPC .......... H01L 23/53228; H01L 23/48–23/5389; H01L 21/31116; H01L 21/76804; H01L 21/76816; H01L 29/41–29/42396
See application file for complete search history.

(56) References Cited

U.S. PATENT DOCUMENTS

| | | | |
|---|---|---|---|
| 6,232,225 B1 * | 5/2001 | Pong ................. | H01L 21/31116 257/E21.252 |
| 6,249,016 B1 * | 6/2001 | Chaudhry ......... | H01L 27/10808 257/296 |
| 6,380,065 B1 * | 4/2002 | Komai et al. ................. | 438/622 |
| 6,462,395 B1 * | 10/2002 | Fukuda et al. ................ | 257/520 |
| 6,740,584 B2 * | 5/2004 | Eimori ............. | H01L 21/76804 257/E21.577 |
| 6,784,102 B2 * | 8/2004 | Yeung ................. | H01L 23/5226 257/E21.576 |
| 2007/0123032 A1 * | 5/2007 | Yamazaki ..................... | 438/624 |
| 2015/0014778 A1 * | 1/2015 | Cheng ................ | H01L 23/5226 257/369 |

* cited by examiner

*Primary Examiner* — Stephen W Smoot
*Assistant Examiner* — Sun M. King
(74) *Attorney, Agent, or Firm* — Stout, Uxa & Buyan, LLP; Frank J. Uxa

(57) ABSTRACT

A semiconductor interconnect structure is formed as a via with an inverted-T shape to increase the reliability of the interface between the interconnect structure and an underlying electrically conductive, e.g., copper (Cu), layer of material. The inverted-T shape effectively increases a bottom critical dimension of the via, thereby reducing and/or eliminating via degradation of the interconnect structure caused by voids in the electrically conductive layer introduced during high-temperature or stress-migration baking.

14 Claims, 3 Drawing Sheets

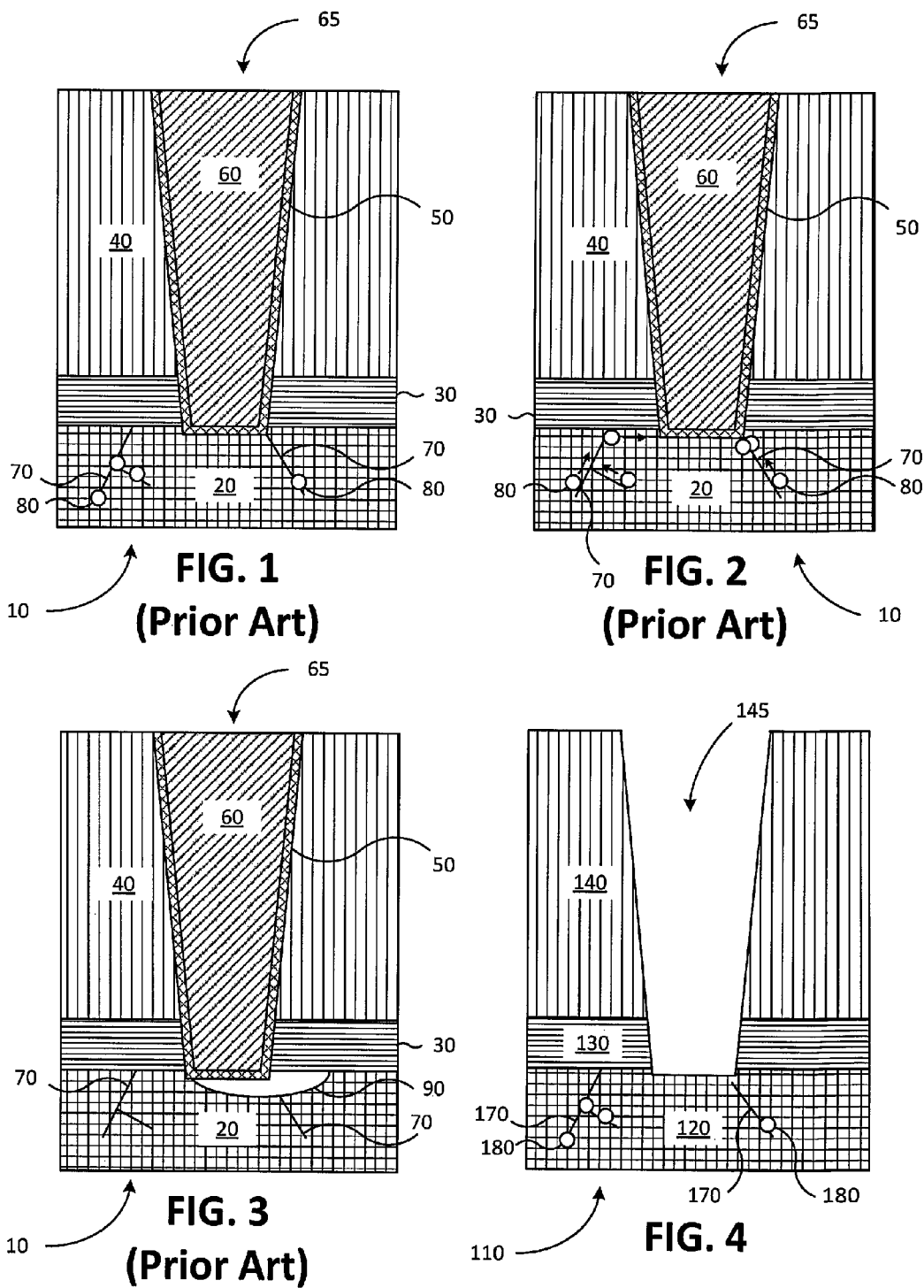

INVERTED-T SHAPED VIA FOR REDUCING ADVERSE STRESS-MIGRATION EFFECTS

BACKGROUND OF THE INVENTION

1. Field of the Invention

The present invention relates generally to semiconductor fabrication methods and, more particularly, to fabrication of interconnect structures, e.g., vias, in semiconductor devices containing, for instance, copper.

2. Description of Related Art

Vias are formed in semiconductor structures to connect components on one layer to components on another. During manufacturing processes various imperfections may manifest themselves in an integrated circuit wafer. In order to reduce the effects that may be currently associated with such imperfections, as well as future effects which may develop, wafer tests are performed for predetermined parameters to help assure operation. For instance, process and material weaknesses may be identified by applying a set of stress tests during or at the conclusion of chip fabrication.

Stress testing can help to control the incidence of early-life failure or so-called infant mortality in a semiconductor product, such as in the case where effects of moderate or long term operation of a product may be simulated. A simulation may be enacted by relatively short-term application of expected or augmented stresses during a reliability-testing phase, thereby inducing failures in marginal components. A particular implementation of the concept, known as high temperature or stress-migration baking, applies stress in the form of radiant energy to generate testing-reliability information for a given integrated circuit(s) or component (s). The high temperatures, typically on the order of 150° C. to 250° C., may expose defects that could cause suboptimal performance or even failure when a product is later distributed and placed into use.

According to certain scenarios, such as those involving the coupling of an interconnect structure (e.g., via) to an electrically conductive layer (e.g., copper), slight or hidden imperfections corresponding to grains in the electrically conductive layer may produce failure issues that develop or become evident later or during stress-migration baking. That is, performance tests conducted prior to application of the stress-migration baking may expose no or relatively few failure incidents in this regard. A consequence of the stress-migration baking step is to cause migration of micro-vacancies in the electrically conductive layer and movement toward/clustering of those micro-vacancies to a vicinity under the interconnect structure, thereby creating void(s) between the interconnect structure and the electrically conductive layer. Such voids (i.e., vacancy clusters) can introduce resistance to the interconnect structure or, in more pronounced cases, cause the conductive pathway of a via to be blinded, obstructed or otherwise inhibited with a commensurately detrimental effect upon manufacturing reliability, efficiency and cost.

A related issue in semiconductor manufacturing involving, for instance, a copper process, is adhesion between a barrier layer in an interconnect structure, such as a via, and the underlying electrically conductive structure, e.g., in this case, the copper. Failure to achieve good adhesion may undesirably increase via resistance.

Yet another issue presented at the juncture between the interconnect structure (e.g., via) and electrically conductive layer (e.g., copper) is the physical stress gradient that naturally exists at this interface during processing and reliability testing.

A need thus exists in the prior art for an interconnect structure that is not unduly susceptible to the effects of vacancy clustering. A further need exists for a method of assuring good via barrier/copper adhesion and/or reducing the mentioned physical stress gradient.

SUMMARY OF THE INVENTION

The present invention addresses these needs by providing a method of forming an interconnect structure, such as a via, with an enlarged-base shape, such as a cone or truncated-cone shape, or the shape of an inverted-T.

The interconnect structure may be formed in a semiconductor structure. For example, the semiconductor structure may comprise an electrically conductive (e.g., copper) layer disposed in the structure, a capping layer that overlays the electrically conductive layer, a layer of dielectric material formed over the capping layer, and an interconnect structure. The interconnect structure may be disposed in the layer of dielectric material and the capping layer, and may make contact with the electrically conductive layer. The interconnect structure may have a first dimension at a bottom or bottom surface of the dielectric layer, a second dimension at a top or top surface of the capping layer, and a third dimension at a bottom or bottom surface of the capping layer. In one example, the second dimension may be not less than the first dimension.

In one example of the invention, the third dimension can be not less than the second dimension. In one example, the third dimension can be less than the second dimension.

In one example, the interconnect structure exhibits a fourth dimension at a top or top surface of the dielectric layer, The fourth dimension not less than the first dimension, thereby preventing bridging of tops of adjacent vias.

While the apparatus and method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

BRIEF DESCRIPTION OF THE DRAWINGS

FIG. 1 depicts a conventional interconnect structure making contact with an electrically conductive (e.g., copper) layer, the electrically conductive layer having a grain structure with micro-vacancies;

FIG. 2 conceptualizes the migration of micro-vacancies in the structure of FIG. 1 during high-temperature (e.g., stress-migration) baking;

FIG. 3 portrays a state following coalescing of the micro-vacancies of FIG. 2, effectively resulting in a blinded via;

FIG. 4 corresponds to the provision of an opening in dielectric and capping layers preparatory to forming an interconnect structure, e.g., via, according to the present invention;

DETAILED DESCRIPTION OF THE INVENTION

Figure 5:
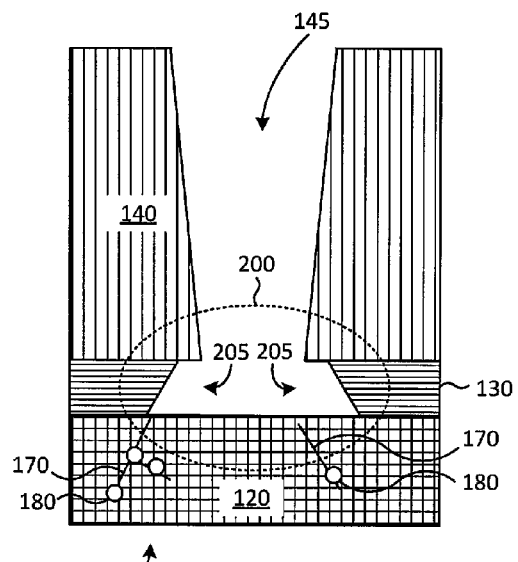
FIG. 5 presents the result of applying a high-pressure etch to the structure of FIG. 4, thereby creating an inverted-T shaped opening.

Examples of the invention are now described and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not. According to certain implementations, use of directional terms, such as, top, bottom, left, right, upper, lower, over, above, below, beneath, rear, and front, are to be construed literally, while in other implementations the same use should not. The present invention may be practiced in conjunction with various integrated circuit fabrication and other techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to an interconnect structure, e.g., in the form of a via, having an inverted-T shape and a related method of manufacture.

Referring more particularly to the drawings, FIG. 1 illustrates an interconnect structure, e.g., via 65, formed between layers of a semiconductor device. An integrated circuit structure 10 comprises an electrically conductive element, e.g., in the form of a pillar formed of metal, including but not limited to a copper (Cu) material. As illustrated, the integrated circuit structure 10 comprises a layer 20 of electrically conductive material, such as copper, overlaid with a capping layer 30 with a dielectric layer 40 overlaying the capping layer 30. An opening is formed in the dielectric layer 40 and the capping layer 30. The opening is lined with a barrier material 50 and then filled with electrically conductive material, e.g., metal 60, which may be, for example, tungsten (W) and/or copper. Particulars on the formation of the via 65 can follow generally accepted and known process steps that are not detailed herein.

When the electrically conductive layer 20 includes a material such as copper that may contain imperfections due to grains 70 in the material, vacancies (e.g., micro-vacancies 80) may appear in and be associated with these imperfections. Initially, e.g., at this early stage, the imperfections, themselves, may have a negligible effect on the gross characteristics of the electrically conductive material and/or may be ignored.

During ensuing manufacturing of the semiconductor device or integrated circuit, heating or baking may be introduced, e.g., at temperatures ranging between about 150° C. and about 250° C., causing one or more of (i) reduction/elimination of stresses in the integrated circuit and (ii) inducing migration of the micro-vacancies 80. For instance, the micro-vacancies may migrate along grains 70 in the electrically conductive layer 20 as represented by arrows adjacent the micro-vacancies 80 in FIG. 2.

In some instances a number of the migrating micro-vacancies 80 may coalesce to form one or more voids, such as void 90, in the electrically conductive layer 20 as shown in FIG. 3. This void (i.e., vacancy cluster) may form under the via 65, thereby increasing via resistance and/or, in pronounced cases, resulting in a blinded via, that is, a via that fails to provide an operable or optimal conduction path between integrated circuit layers. Blinded vias are undisputedly considered to be serious defects in most integrated-circuit contexts, owing to their presence being associated with reduced yields, and commensurately increased costs of manufacture.

The present invention attenuates or eliminates significant increases in resistance of interconnect structures, such as vias, by reducing the incidence of a blinded via by way of unique interconnect structures having an enlarged-base shape, such as a cone or truncated-cone shape, or the shape of an inverted-T. Formation of the via can begin as illustrated in FIG. 4 by forming an opening 145 in an integrated circuit structure 110 having a layer of electrically conductive material 120 overlaid with a capping layer 130 that is, in turn, overlaid by dielectric layer 140. Examples of the present invention can fabricate the capping layer 130 of materials such as SiN, SiCN, and SiCOH. The dielectric layer 140 can be formed of, for example, an oxide such as silicon dioxide, tetraethyl orthosilicate, and low-k oxide, i.e., an oxide having a small dielectric constant relative to silicon dioxide. The opening 145 may be formed in the dielectric layer 140 by a process (e.g., a VA or via etch) that etches through the dielectric layer 140 and the capping layer 130 with a shape of the opening 145 (e.g., hole) determined by photolithographic patterning. One example of a VA etch may include a main etch (ME) and/or an over-etch (OE) step to etch through the dielectric (e.g., $SiO_2$) layer 140 and stop on the capping layer 130 followed by a strip step to remove photoresist material (not shown). An additional step (e.g., a break-through step) may break through the capping layer 130, and a post etch treatment (PET) step may be performed to deoxidize and/or degas any impurities (e.g., CuF and/or CuO) formed on the surface of the conductive (e.g., Cu) layer 120. The purpose of the VA etch is to break through the dielectric film and fill-in metal.

In one example, the present invention provides new structure/shape of the VA etch. The VA ETCH process may include multiple steps with different chemicals to break through different film stacks. ME and OE are two of the steps to break through a dielectric film(SiO2) and stop on a capping layer. In one example, the ME step may consume most of the film and then change to an OE step. The OE step occurs generally with a slower etch rate (ER) but better selectively for dielectric film capping layer to ensure breakthrough of the dielectric film on the whole wafer and stopping on the capping layer.

Figure 6:
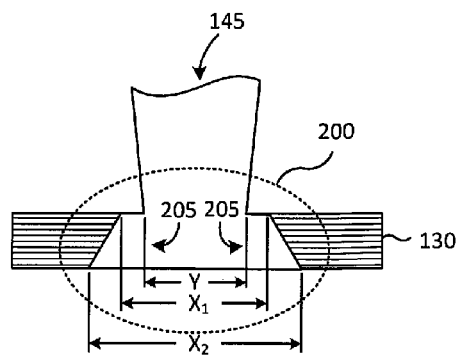
FIG. 6 details the inverted-T shaped opening of FIG. 5, emphasizing relative dimensions.

The break-through step in the VA etch may be performed by applying high pressure, for example, a pressure ranging from about 40 millatorrs (mt) or more, for example, about 40 millitorrs (mt) or about 100 mt to about 300 mt with a typical value of about 50 mt, and etching with a gas such as $CF_4/Ar/O_2$ to pull back the capping layer 130 from the opening 145 to create an undercut 205 of the dielectric layer 140 and to enlarge a bottom dimension, for example, a bottom critical dimension (CD), of the integrated circuit structure 110 as shown in FIG. 5. The undercut 205 in the capping layer 130 is described in greater detail with attention to a region 200 of FIG. 5 as shown in FIG. 6.

As elucidated in the figure (FIG. 6), the undercut 205 may be at least partially characterized by three measurements. Referring particularly to the embodiment in this regard, yet without limitation of or in accordance with other embodiments, examples or features, a first dimension, for example, a first critical dimension, denoted as Y, may be defined as a width of the opening 145 at the bottom of the dielectric layer 140. A second dimension, for example, a second critical dimension, $X_1$, may represent a width of the opening 145 at the top of the capping layer 130, and a third dimension, for example, a third critical dimension, $X_2$, may represent a width of the opening 145 at the bottom of the capping layer 130.

A taper or angle of taper of sidewalls defining the opening 145 in the dielectric layer 140 region corresponds to a truncated inverted-cone shape, whereas the taper or angle of taper of sidewalls defining the opening 145 in the capping layer 130 region (e.g., the undercut 205 region) corresponds to a truncated cone shape. Alternatively, or additionally, but not equivalently or interchangeably, modified embodiments or examples may comprise cylindrical or about cylindrical shapes instead of or in combination with either or both of the mentioned truncated inverted-cone and truncated cone shapes.

In the illustrated embodiment, a taper angle of sidewalls defining the truncated inverted-cone shape may range from about 80° to about 90° with a typical value of about 88°, a taper angle of sidewalls defining the truncated cone shape may range from about 45° to about 90° or greater with a typical value of about 90° or greater. An undercut distance, $X_1$-Y, may range from about 0 nanometers (nm) to more than about 0 nm, with a typical value of about 0 nm, and a thickness of the capping layer 130 may range from about 300 Å to about 800 Å with a typical value of about 500 Å.

Various configurations of these three dimensions, for example, critical dimensions, may be employed in order to achieve the objectives of the present invention. For example, the second dimension, $X_1$, may be greater than or equal or about equal to (e.g., not less than) the first dimension, Y. That is, $X_1 \geq Y$. Alternatively, the second dimension, $X_1$, may be about equal to or less than or about less than the first dimension, Y.

Per an additional or alternative configuration-related feature, the third dimension, $X_2$, may be not less than the first dimension, Y. That is, $X_2 \geq Y$. If $X_1 = Y$, then the feature requires that $X_2 \geq X_1$, which is to say that the third dimension, $X_2$, must be greater than the second dimension, $X_1$, when the second dimension, $X_1$, is the same as the first dimension, Y. Alternatively, the second dimension, $X_1$, may be about equal to (i.e., not necessarily the same or greater than) the first dimension, Y. As another alternative, the third dimension, $X_2$, may be about equal to or less than or about less than the first dimension, Y, with a proviso for instance that a taper or angle of taper of the opening 145 in the dielectric layer 140 region should be different (e.g., defining a greater taper or taper angle) than a taper or angle of taper of the opening 145 in the capping layer 130 region.

In one example, the interconnect structure exhibits a fourth dimension, for example, critical dimension at the top surface of the dielectric layer, which fourth dimension is not less than the first dimension, whereby bridging of tops of adjacent vias is avoided.

Any and/or all of the above features/conditions create an opening 145 having an enlarged bottom dimension (or a relatively enlarged bottom dimension, as compared to the interconnect structure of FIG. 4) that makes contact with electrically conductive layer 120.

Enlargement of the bottom dimension of the opening 145 can reduce the stress gradient (e.g., physical stress gradient) during the manufacturing process and during subsequent reliability testing because of geometrical enhancement as shown (e.g., lending to a reduced physical stress gradient and/or more surface area at a vicinity of the third dimension, $X_2$, and also possibly lending to a reduced physical stress gradient and/or more surface area at a vicinity of the second dimension, $X_1$, and/or reducing the impact of voids 90 or 190 as described herein). Further, the enlargement increases an exposed area of the electrically conductive layer 120 (e.g., Cu), which may improve efficiency of degassing procedures applied before barrier deposition. Degassing procedures may comprise heating the wafer to about 300° C. to drive out gas, such as post-etch fluorine, remaining on or near the surface of the electrically conductive layer 120.

Before barrier deposition, there may still be unclear polymer or post-etch fluorine remaining on the electrically conductive layer 120, which would worsen the metal adhesion during barrier deposition. Moreover, such unclear polymer remaining might become the weak point for stress release during stress migration baking, which would reduce the effectiveness of the baking. Since this may be a significant concern, in one example it may be advantageous, before barrier deposition, to remove such unclear remaining by heating the wafer to degassing procedures.

The above-discussed dimension enlargement(s) also may improve the performance of additional manufacturing steps such as degas cleaning before deposition of the VA barrier. Such cleaning may result in improved adhesion between the electrically conductive layer 120 and the via barrier 150.

Figure 7:
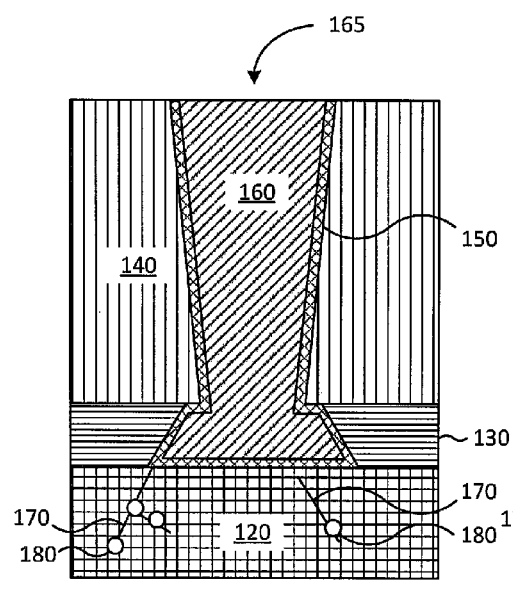
FIG. 7 shows an effect of lining the opening of the structure of FIG. 5 with a barrier material and then filling the opening with metal to form an interconnect structure, e.g., via, having an inverted-T shape.

FIG. 7 illustrates a result of lining the opening 145 with VA barrier material 150 such as Ti/TiN and/or TaN/Ta using a process of CVD (chemical vapor deposition) or PVD (physical vapor deposition). The lined opening 145 then may be filled with electrically conducting material, such as metal 160, e.g., copper and/or tungsten, to form a via 165.

As suggested by FIG. 7, when the dimension relationships previously outlined are maintained, an area of contact between the via metal/barrier material 160/150 and the underlying electrically conductive layer 120 is increased relative to the corresponding area of contact between via metal/barrier material 60/50 and the underlying electrically conductive layer 20 of the prior-art via 65 shown in FIG. 1. Furthermore, an area of contact between the via metal 160 and the barrier material 150 is increased, as is an area of contact between the dielectric layer 140 and the barrier material 150 and also even an area of contact between the capping layer 130 and barrier material 150.

Figure 8:
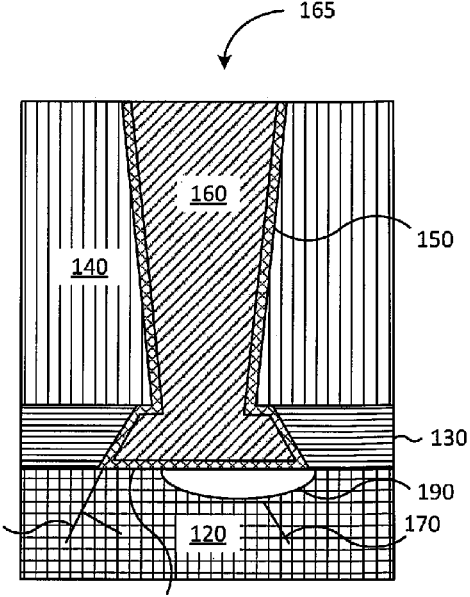
FIG. 8 illustrates coalescing of micro-vacancies without creation of a blinded via according to the present invention.

One advantage that accrues from the formation of the interconnect structure according to the present invention is demonstrated in FIG. 8, wherein micro-vacancies have coalesced to become a void 190 in the electrically conductive layer 120, the void (i.e., vacancy cluster) lying immediately under the via 165. This situation can be compared with that described above relative to FIG. 3 where a void 90 effectively blinds a via. In contrast, the via 165 illustrated in FIG. 8 retains a suitably operational contact region 195 between the interconnect structure (e.g., via 160) and the electrically conductive layer 120 so that the via 165 is not blinded, and the interconnect structure may still provide a required connectivity between layers.

The present invention creates a larger area of contact between the opening 145 and the electrically conductive layer 120. As such, a void (i.e., vacancy cluster) of a given size can present a lower risk of blinding the whole interface between the via 160 and the electrically conductive layer 120 as compared with prior art methods. It should be noted that enlargement of the bottom dimension of the via 165 has no effect on the dimension of the top of the via 165, so that the present invention does not increase incidence of bridging at the top surface of the via 165.

Figure 9:
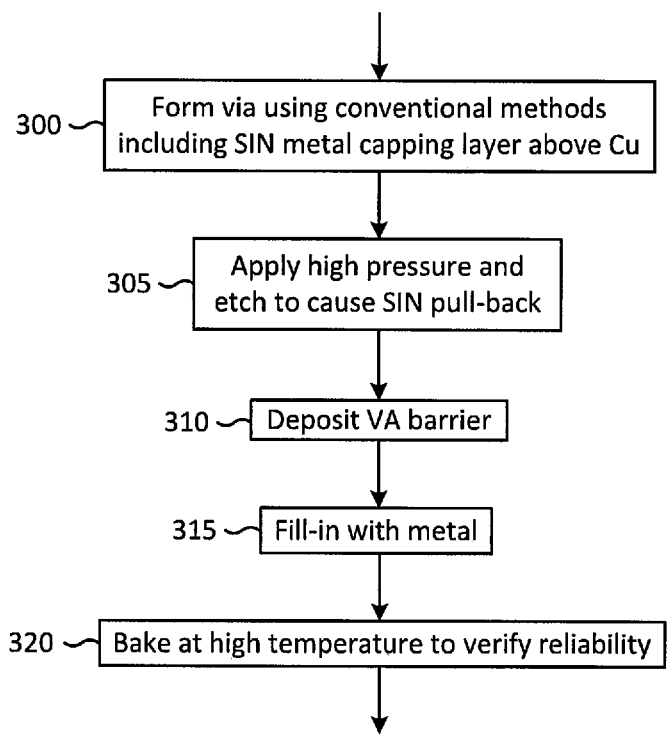
FIG. 9 is a flowchart that summarizes a method of the present invention.

FIG. 9 is a flow chart that provides an overview of a method of the present invention. According to the overview, an opening in which an interconnect structure may be formed is created using conventional methods at step 300. An example of such an opening is shown in FIG. 4, which illustrates an electrically conductive layer 120, a capping layer 130, and a dielectric layer 140, with an opening 145 formed in the dielectric layer 140 and the capping layer 130 exposing a portion of the electrically conductive layer 120.

At step 305 a high-pressure etch, which may employ $CF_4/Ar/O_2$ gas, may be performed, the etch having an effect of pulling back the capping layer 130 to enlarge a bottom portion of the opening 145, thereby serving to create an undercut 205 as illustrated in FIG. 5. Step 310 comprises depositing a VA barrier 150 (cf. FIG. 7), which may comprise Ti and/or TiN deposited by a CVD or PVD process to line the opening 145 (e.g., via hole) and the surface of the electrically conducting layer 120 (e.g., Cu). The opening 145 may then be filled-in with metal, for example, tungsten (W), at step 315 to create an interconnect structure (e.g., via 165). The VA barrier 150 may improve adhesion between the electrically conductive layer 120 (e.g., Cu) and the filled-in metal (e.g., W) and, further, may prevent the Cu from penetrating into the W. High-temperature (e.g., stress-migration) baking to create stress migration and verify device reliability may be performed at step 320.

Although the disclosure herein refers to certain illustrated embodiments, it is to be understood that these embodiments have been presented by way of example rather than limitation. For example, it will be appreciated that the invention can be applied to any/all back-end-of-line processes in the manufacture of any semiconductor devices, including those that include copper processes. The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

What is claimed is:

1. A semiconductor structure comprising:
   an electrically conductive layer disposed in the structure;
   a capping layer that overlays the electrically conductive layer, the capping layer having an opening extending through the entire capping layer, the opening being in the shape of a truncated cone having a first taper angle;
   a layer of dielectric material formed over the capping layer, the layer of dielectric material having an opening in the shape of a truncated inverted cone having a second taper angle, wherein the second taper angle is different from the first taper angle; and
   an interconnect structure disposed in the layer of dielectric material and the capping layer, the interconnect structure making contact with the electrically conductive layer,
   wherein the interconnect structure has a first dimension at a bottom surface of the dielectric layer and a second dimension at a top surface of the capping layer that is wider than the first dimension.

2. The semiconductor structure as set forth in claim 1, wherein the interconnect structure has a third dimension at a lower region of the capping layer different than the second dimension.

3. The semiconductor structure as set forth in claim 2, wherein the third dimension is wider than the second dimension.

4. The semiconductor structure as set forth in claim 2, wherein the third dimension is at a bottom surface of the capping layer.

5. The semiconductor structure as set forth in claim 2, wherein the third dimension is not less than the second dimension.

6. The semiconductor structure as set forth in claim 1, wherein the interconnect structure comprises a via exhibiting an inverted T-shape.

7. The semiconductor structure as set forth in claim 1, wherein the electrically conductive layer comprises a material selected from the group consisting of copper, aluminum, doped silicon and mixtures thereof.

8. The semiconductor structure as set forth in claim 1, wherein the capping layer comprises one or more compounds of silicon chemical composition.

9. The semiconductor structure as set forth in claim 1, wherein the capping layer comprises nitride.

10. The semiconductor structure as set forth in claim 1, wherein the layer of dielectric material comprises one or more of an oxide of silicon, tetraethyl orthosilicate, and a low-k oxide.

11. The semiconductor structure as set forth in claim 2, wherein the interconnect structure further exhibits a fourth dimension at a top surface of the dielectric layer, the fourth dimension being not less than the first dimension, whereby bridging of tops of adjacent vias is avoided.

12. A semiconductor structure including an interconnect structure having an inverted shape in the semiconductor structure comprising:
   an electrically conductive layer;
   a capping layer disposed over the electrically conductive layer, the capping layer having a first opening extending through the entire capping layer, the first opening being in the shape of a truncated cone defined by a first taper angle;
   a dielectric layer overlaying the capping layer, the dielectric layer having a second opening in the shape of a truncated inverted cone defined by a second taper angle, wherein the second taper angle is smaller than the first taper angle; and
   an interconnect structure formed within the first and second openings and having a first dimension at the bottom surface of the dielectric layer, a second dimension at a top surface of the capping layer and a third dimension at the bottom of the capping layer, wherein the second dimension is greater than the first dimension.

13. The semiconductor structure as set forth in claim 1, wherein the capping layer and the dielectric layer are in direct contact.

14. The semiconductor structure as set forth in claim 12, wherein the capping layer and the dielectric layer are in direct contact.

* * * * *